US006972224B2

(12) United States Patent
Gilmer et al.

(10) Patent No.: US 6,972,224 B2
(45) Date of Patent: Dec. 6, 2005

(54) METHOD FOR FABRICATING DUAL-METAL GATE DEVICE

(75) Inventors: David C. Gilmer, Austin, TX (US); Srikanth B. Samavedam, Austin, TX (US); Philip J. Tobin, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/400,896

(22) Filed: Mar. 27, 2003

(65) Prior Publication Data

US 2004/0191974 A1 Sep. 30, 2004

(51) Int. Cl.[7] .......................................... H01L 21/8238
(52) U.S. Cl. ...................... 438/199; 438/216; 438/279; 438/585
(58) Field of Search ................................ 438/199, 216, 438/223, 224, 227, 228, 229, 279, 286, 287, 438/591, 592, 652

(56) References Cited

U.S. PATENT DOCUMENTS

| 6,410,376 B1 * | 6/2002 | Ng et al. ..................... 438/199 |
| 6,563,178 B2 * | 5/2003 | Moriwaki et al. ........... 257/369 |
| 6,642,132 B2 * | 11/2003 | Cho et al. ..................... 438/592 |

FOREIGN PATENT DOCUMENTS

| WO | WO 01/97257 A2 | 12/2001 |
| WO | WO 01/97257 A3 | 12/2001 |

OTHER PUBLICATIONS

Samavedam et al., "Dual-Metal Gate CMOS with HfO$_2$ Gate Dielectric," 2002 *IEDM Technical Digest,* pp. 17.2.1-17.2.4, 2002.

Yeo et al., "Dual-Metal Gate CMOS Technology with Ultrathin Silicon Nitride Gate Dielectric," *IEEE Electron Device Letters,* May 2001, vol. 22, No. 5, pp. 227-229.

* cited by examiner

Primary Examiner—Jack Chen
(74) Attorney, Agent, or Firm—James L. Clingan, Jr.

(57) ABSTRACT

A method of fabricating a MOS transistor that comprises a dual-metal gate that is formed from heterotypical metals. A gate dielectric (34), such as HfO$_2$, is deposited on a semiconductor substrate. A sacrificial layer (35), is next deposited over the gate dielectric. The sacrificial layer is patterned so that the gate dielectric over a first (pMOS, for example) area (32) of the substrate is exposed and gate dielectric over a second (nMOS, for example) area (33) of the substrate continues to be protected by the sacrificial layer. A first gate conductor material (51) is deposited over the remaining sacrificial area and over the exposed gate dielectric. The first gate conductor material is patterned so that first gate conductor material over the second area of the substrate is etched away. The sacrificial layer over the second area prevents damage to the underlying dielectric material as the first gate conductor material is removed.

11 Claims, 2 Drawing Sheets

METHOD FOR FABRICATING DUAL-METAL GATE DEVICE

BACKGROUND OF THE INVENTION

1. Field of the Invention

The invention relates generally to the design and fabrication of semiconductor devices and, more particularly, to the design and fabrication of a metal oxide semiconductor (MOS) device having a dual-metal gate, wherein fabrication of the dual-metal gate is achieved in a manner that abates damage to the dielectric material underlying the gate.

2. Related Art

Semiconductor device technology continues the ineluctable advance into the realm of submicron feature sizes. As a consequence of the reduction in feature sizes, aspects of device design and fabrication that were once ignored, because they gave rise to only second-order effects in long-channel devices, are now significant, and have animated numerous modifications to conventional device design and fabrication techniques. For example, the aggressive scaling of channel length and gate oxide thickness in a conventional MOS transistor exacerbates problems of polysilicon gate depletion, high gate resistance, high gate tunneling leakage current and dopant (i.e., boron) penetration into the channel region of the device. In particular, CMOS technology, which once relied on polysilicon as a gate conductor and silicon dioxide as a gate dielectric, now contemplates the use of dual-metal gate conductors and metal oxide (MeOx) gate dielectrics.

MeOx gate dielectric materials are advantageous because they exhibit a relatively high dielectric constant (K), thereby enabling the deposition of a thicker gate dielectric layer without adversely affecting the physical and electrical characteristics of the deposited dielectric layer. For example, thin oxide films are susceptible to catastrophic breakdowns when stressed by high electric fields. $SiO_2$, in particular, can withstand a maximum electric field of approximately 12 mv/cm. A number of transition metal oxides have been demonstrated to be suitable as a substitute for $SiO_2$ in this application, including, for example, oxides of zirconium, hafnium, aluminum, lanthanum, strontium, titanium and combinations thereof.

In addition to enhancements in the gate dielectric, substantial interest has been engendered in the use of metal gates as an alternative to polysilicon. Metal gates not only obviate gate-depletion and boron-penetration effects, but also provide a significantly lower sheet resistance. In one approach, a monolithic gate structure may be incorporated in a CMOS design. Consonant with this approach, a metal with a work function at approximately the midpoint of the valence and conduction bands of silicon has been employed. However, it has been determined that, given such a value for the metal work function, the resulting device threshold voltage, $V_T$, is too high for tractable channel doping. Channel counter-doping to reduce $V_T$ gives rise to other problems, such as degradation in short-channel and turn-off characteristics. A solution, in the form of an integrated, dual-metal gate, has therefore been suggested for use in CMOS design. A CMOS transistor design that is predicated on a MeOx gate dielectric and an integrated dual-metal gate conductor is described below.

FIG. 1 is a simplified cross-sectional view of a prior-art CMOS transistor 10 that incorporates a MeOx gate dielectric 11 and an integrated dual-metal gate conductor 12. The CMOS transistor itself includes a pMOS transistor 101 that is typically formed in an n-well (not shown) and an nMOS transistor 102 that is formed in a p-well (not shown). Device designers understand a priori that CMOS transistor 10 also includes trench isolation (not shown in FIG. 1) in the substrate to separate pMOS transistor 101 from nMOS transistor 102. Gate dielectric 11 is deposited on the surface of the semiconductor substrate over both the pMOS transistor 101 and the nMOS transistor 102. As suggested above, CMOS transistor 10 also incorporates a dual-metal gate conductor 12 in the form of first metal gate conductor 121 and second metal gate conductor 122. First metal gate conductor 121 is deposited and formed on gate dielectric 11 over pMOS region 101. Second metal gate conductor 122 is deposited over first metal gate conductor 121 and on gate dielectric 11 over nMOS region 102.

As indicated above, and for reasons that will presently be offered, dual-metal gate conductors 121 and 122 are formed from heterotypical metallic materials. Specifically, it has been found that favorable performance is attained when the work function of first metal conductor 121 (formed over pMOS region 101) is close to the valence band of silicon and the work function of the second metal conductor 122 (formed over nMOS region 102) is close to the conduction band of silicon. In practice, it is now relatively well established that for bulk CMOS at gate lengths below 50 nanometers, two different gate metals with respective work functions within about 0.2 eV of the band edges (conduction and valence) of silicon are indicated. Accordingly, candidates for metal gate conductor 121 include rhenium, iridium, platinum, molybdenum, ruthenium and ruthenium oxide; candidates for metal gate conductor 122 include titanium, vanadium, zirconium, tantalum, aluminum, niobium, and tantalum nitride. It is not to be presumed, however, that the above enumeration is exhaustive, and other metals, alloys or compounds may be, or may be found to be, suitable (or use as gate conductors in a dual-metal gate architecture.

In general, an existing process of fabricating the gate structure of CMOS transistor 10 proceeds as depicted elliptically in FIG. 2. Subsequent to the deposition of MeOx gate dielectric 11 on the substrate surface, the first metal gate conductor 121 is deposited, preferably by chemical vapor deposition (CVD) techniques, although other deposition techniques, such as physical vapor deposition (PVD) or atomic layer deposition (ALD), may also be utilized. The first metal material is then photolithographically patterned so that the first metal material over pMOS region 101 is protected with photoresist 21. As is illustrated in FIG. 2, a metal removal etch is then performed so that the first metal material over nMOS region 102 is removed down to dielectric layer 11. In one embodiment, metal removal may be effected with a wet etch in a solution of sulphuric acid, hydrogen peroxide and water. The second metal material is then deposited, resulting in the structure embodied in FIG. 1.

The above process introduces a potential for damage to gate dielectric 11, in the area over nMOS region 102. The vulnerable area of gate dielectric 11 is illustrated as the dashed region 111 in FIG. 2. The etiology of this problem may be appreciated with reference to FIG. 2. First, the area of dielectric layer 11 that covers nMOS region 102 is subjected to two metal deposition steps: initially when the first metal material is deposited and again when the second metal material is deposited. But perhaps more detrimentally, the nMOS portion of gate dielectric 11 is exposed to the metal removal etch process that is applied to selectively remove the first metal material over the nMOS region. The removal of first metal 121 over nMOS region 102 is almost inevitably attended by damage to the exposed gate dielectric.

Although the above process has been demonstrated to be acceptable when certain robust MeOx materials ($HfO_2$, for example) are used as the gate dielectric material, it is predictable that other gate dielectrics will experience damage when subjected to the above-described dual-metal integration process. Accordingly; what is required is a method of fabricating a dual-metal gate device without distress to the MeOx dielectric layer.

BRIEF DESCRIPTION OF THE DRAWINGS

The subject Method for Fabricating Dual-Metal Gate Device may be better understood by, and its many features, advantages and capabilities made apparent to, those skilled in the art with reference to the Drawings that are briefly described immediately below and attached hereto, in the several Figures of which identical reference numerals (if any) refer to identical or similar elements and wherein.

Figure 1:
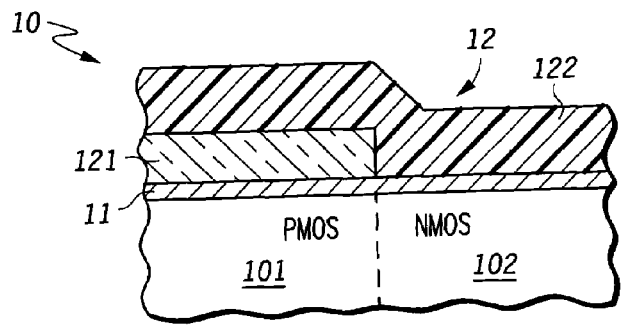
FIG. 1 is a simplified cross-sectional view of a CMOS transistor that incorporates a MeOx gate dielectric (11) and an integrated dual-metal gate (121, 122) conductor in accordance with the prior art.

Skilled artisans appreciate that elements in Drawings are illustrated for simplicity and clarity and have not (unless so stated in the Description) necessarily been drawn to scale. For example, the dimensions of some elements in the Drawings may be exaggerated relative to other elements to promote and improve understanding of embodiments of the invention.

DETAILED DESCRIPTION OF THE PREFERRED EMBODIMENT(S)

For a thorough understanding of the subject Method for Fabricating a Dual-Metal Gate Device, reference is made to the following Detailed Description, which includes the appended Claims, in conjunction with the above-described Drawings.

In a manner that will be made eminently clear below, the subject invention subsists, in one form, in a method for fabricating a semiconductor device, such as, for example, a CMOS transistor, having an integrated gate conductor that is formed from at least two, respectively different, metallic materials. Heretofore, the integration of MeOx gate dielectrics in CMOS devices necessitated a metal removal etch, stopping at the MeOx layer, in order to remove a portion of the first gate conductor material in anticipation of the deposition of the second gate conductor material. It has been demonstrated that the removal etch of the first gate conductor material can result in damage to the underlying MeOx. The fabrication process described here obviates potential damage to the underlying gate dielectric by protecting the gate dielectric with a sacrificial ($SiO_2$, for example) layer.

An appreciation of the subject invention may be conveniently acquired by inspection of FIG. 3 through FIG. 6, which together constitute pertinent aspects of the process flow schematic for the fabrication of a dual-metal gate CMOS transistor. It should be understood, however, that the invention described herein is not confined in applicability to the fabrication of CMOS devices.

Figure 3:
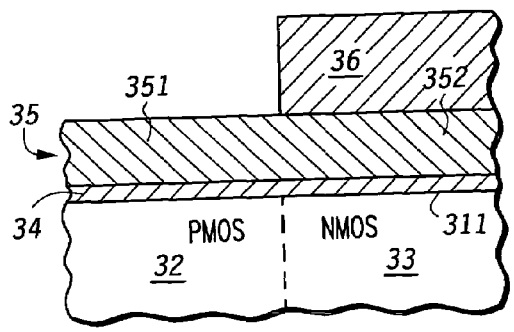
FIG. 3 through FIG. 7 constitute a process flow schematic in accordance with the subject invention and illustrate the manner in which a sacrificial layer may be used to avoid damage to the gate dielectric.

Directing attention now to FIG. 3, in a conventional manner, a semiconductor substrate 31 is provided. Substrate 31 accommodates the formation of pMOS transistor 32 and nMOS transistor 33. Techniques for forming active device areas in substrate 31 are well known to those skilled in the art and are therefore not illustrated in detail in FIG. 3. Suffice it to say that, in general, substrate 31 may constitute lightly-doped n-type or p-type single-crystal silicon. Subsequent to substrate doping, an n-well (not shown) is formed in substrate 31 to accommodate pMOS transistor 32; and a p-well (not shown) is formed to accommodate nMOS transistor 33. Ordinarily, in the context of a twin-well design such as is suggested here, the n-well is selectively implanted in the area of substrate 31 where pMOS transistor 32 will be formed; and the p-well is selectively implanted in the area of substrate 31 where nMOS transistor 33 will be formed. In one embodiment, the n-well may itself be enclosed within a tub (not shown) having p-type conductivity. In another embodiment, substrate 31 may include a lightly doped epitaxial layer that is formed over heavily doped bulk silicon. That is, substrate 31 may in fact be a $P^-$ epitaxial layer formed in $P^+$ bulk silicon. As is well known, n-type conductivity areas may be formed by implantation with phosphorous or arsenic; p-type conductivity areas may be formed by implantation with boron or antimony. In practice, the pMOS and nMOS areas of the device are separated by an isolation structure (not shown). Various isolation techniques are known and include: LOCOS isolation, shallow trench isolation, deep trench isolation, etc. Depiction and description of isolation techniques is not deemed edifying here and has therefore been omitted for the sake of clarity and simplicity. Furthermore, silicon-on-insulator (SOI) construction may also be employed for the fabrication of CMOS devices, and the subject invention is equally compatible with SOI technology.

With continued reference to FIG. 3, it may be seen that a gate dielectric material 34 is formed on surface 311 of substrate 31. In a preferred embodiment, dielectric material 34 is a MeOx. In a preferred embodiment, MeOx 34 may be $HfO_2$. However, other suitable metal oxides include oxides or oxynitrides of zirconium, hafnium, aluminum, lanthanum, strontium, titanium, silicon and combinations thereof. The advantages of MeOx gate dielectric have been enumerated above. Next, a sacrificial-layer 35 is formed to a thickness of, in one embodiment, 50 to 500 angstroms over the gate dielectric layer 34. Sacrificial layer 35 may be $SiO_2$ that has been deposited in accordance with known techniques. However, other materials, such as organic polymers, photoresist, $Si_3N_4$ and the like, may also be used. The significance of layer 35 will become apparent below.

Figure 4:
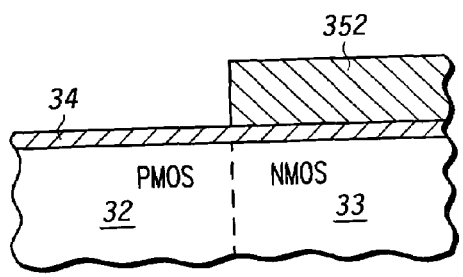

At this point, a photoresist layer 36 is formed on sacrificial layer 35 and is patterned so that the portion 351 of sacrificial layer 35 over the pMOS area is exposed, while the portion 352 of sacrificial layer 35 over the nMOS area is protected by photoresist 36. See FIG. 3. In a preferred embodiment, a wet chemical etching step removes the portion 351 of sacrificial oxide that covers the dielectric material over the pMOS area. Specifically, if sacrificial oxide layer 35 is $SiO_2$, then removal may be effected with an HF solution that is not debilitating to the underlying MeOx layer 34. The result of this process step is illustrated in FIG. 4. Note the remaining portion 352 of sacrificial layer 35 on dielectric material 34 that covers the nMOS area.

Figure 5:
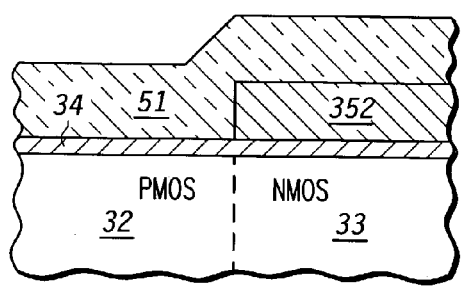

With the remaining sacrificial layer 352 in place, a first gate conductor material 51 is deposited on the dielectric material 34 over the pMOS area and on the remaining sacrificial layer 352. In one embodiment, first gate conductor material 51 may be Ir, for example, and may have a thickness of 50 to 500 angstroms. Other candidates for first metal gate conductor 51 includes rhenium, platinum, molybdenum, ruthenium and ruthenium oxide. The result at this stage of the process is the inchoate gate structure that is illustrated in FIG. 5.

Figure 2:
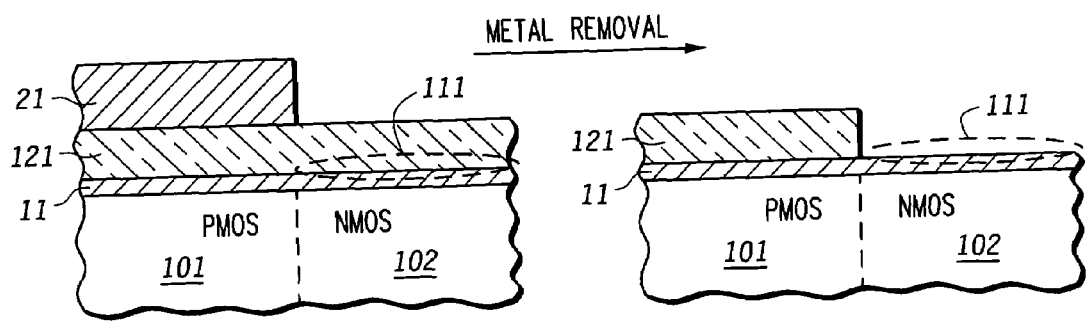
FIG. 2 is a graphical rendition of a metal removal etching step encountered in the fabrication of the device of FIG. 1, illustrating the manner in which damage may be inflicted on the gate dielectric in accordance with the prior art.
Figure 6:
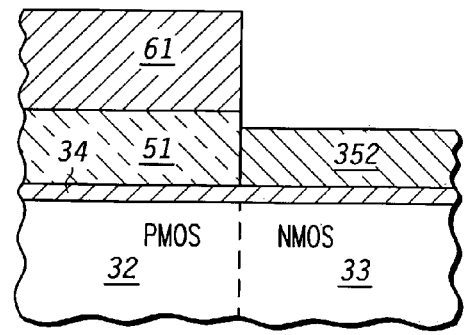

In the next process step, the first gate conductor material 51 is patterned with a photoresist 61. That is, a layer of photoresist 61 is formed over the portion of first gate conductor material that is disposed over the pMOS area. The exposed portion of first gate conductor 51, over the nMOS region of the device, is then subjected to a metal removal step, down to, and perhaps into, the sacrificial layer. Removal of gate conductor is preferably accomplished with a dry, gaseous plasma etch. In the prior art, the plasma etch invariably attacks the underlying MeOx layer. See FIG. 2. However, with respect to the subject invention, sacrificial layer 352 precludes such deleterious effects and enables complete removal of exposed gate conductor material without compromising the gate dielectric. The result at this point is depicted in FIG. 6. The remaining sacrificial layer 352 is then etched away, with a suitable wet chemical etch, and the resist 61 is removed.

Figure 7:
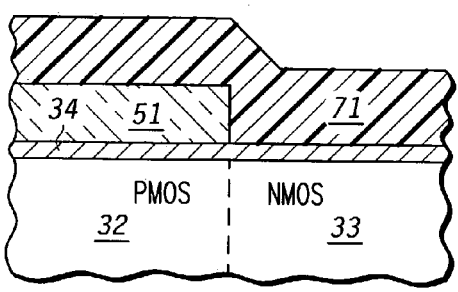

In FIG. 7, a second gate conductor material 71 is deposited (i) over the first gate conductor material 51 that is disposed over dielectric 34 and over pMOS area 32 and (ii) over dielectric material 34 over the nMOS area 33. Second gate conductor material 71 may be TaSiN and may also have a thickness of 50 to 500 angstroms. Other candidates for second gate conductor material 71 include titanium, vanadium, zirconium, tantalum, aluminum, niobium, and tantalum nitride. The resultant is an integrated dual-metal gate (MOS) device with superior performance characteristics that derive from a fabrication process that preserves the integrity of the gate dielectric.

Accordingly, it has been determined that heretofore the process of fabricating an integrated dual-metal gate CMOS transistor introduces the opportunity to cause damage to the gate dielectric material. In one prior-art embodiment, damage is inflicted primarily as a result of the lack of selectivity of the metal etch process used to remove the first gate conductor overlying the gate dielectric of the nMOS transistor. In particular, a dry gaseous plasma etch step commonly used to remove metal gate conductor material also attacks the directly underlying MeOx gate dielectric. Interposing a sacrificial layer over this portion of the gate dielectric material in anticipation of the metal removal step represents a straightforward and effective countermeasure. The gate dielectric easily withstands the wet chemical etch (in HF solution, for example) used to remove the sacrificial layer.

It should be noted that the invention has been described here with reference to a particular embodiment, according to which the first gate conductor is initially formed over the pMOS area of the CMOS transistor and second gate conductor is subsequently formed over the nMOS area. In an alternative embodiment, the first gate conductor may be formed over the nMOS area of the transistor. In this case, metal that is more closely compatible with nMOS characteristics (TaSiN, for example) is initially deposited. In a manner precisely analogous to the fabrication process described above, the second metal conductor is subsequently formed on the first metal conductor, over the nMOS device, and on the gate dielectric over the pMOS device. The second metal conductor in this instance may again be Ir, for example. The point here is that the subject invention comprehends alternative process sequences for the formation of an integrated dual-metal gate conductor in which a sacrificial layer is deployed to protect the gate dielectric. It is important, however, that irrespective of the sequence in which the gate conductors are deposited, the respective gate conductor material should be matched, in the manner identified above, to the conductivity type of the device area over which the conductor is formed.

In addition, numerous dry or wet metal removal etches or processes may be used to effect removal of metal layers in the formation of the dual-metal gate. Similarly, although the invention contemplates the use of $SiO_2$ as a sacrificial layer, other materials, including but not limited to organic polymers, photoresist, $Si_3N_4$, and the like, may be successfully relied on as the sacrificial layer 35. In this regard, removal of the sacrificial layer itself may be accomplished with a dry or wet etch or another amenable removal process, provided that the step used to remove the sacrificial layer 35 results in no appreciable degradation to the underlying dielectric.

The collection of empirical data derived from a dual-metal CMOS device fabricated in accordance with the above has indicated that significant improvements in device characteristics, such as gate capacitance and gate leakage current, are realized thereby. Specifically, the gate capacitance, particularly with applied gate voltages in the range of −1.0 to +1.0 volts, is significantly lower than demonstrated by dual-metal gate devices fabricated without benefit of the subject invention. Similarly, gate leakage current was found to be approximately two orders of magnitude lower over the larger part of gate voltage range of 0 to 2.0 volts.

Furthermore, although the perspicacious practitioner might wonder whether the deposition and subsequent removal of the sacrificial layer over, for example, the nMOS region might itself be attended by damage to the underlying gate dielectric, empirical inspection demonstrates that no derogation in gate characteristics results from removal of the sacrificial layer. That is, the MeOx gate dielectric is indifferent to the removal of the sacrificial layer with a wet chemical etch (in HF solution, for example). When compared to a baseline device that had been fabricated in accordance with a straightforward process in which a single metal gate conductor was deposited on a MeOx gate dielectric, sans an intervening step to remove a sacrificial layer, a device fabricated in accordance with the subject invention was determined to have substantially equivalent gate capacitance and gate leakage characteristics.

Accordingly, in the Description above, the invention has been set forth in the context of specific numerous embodiments, in a manner that is intended to be illustrative and to convey a thorough comprehension of the invention. However, one of ordinary skill in the art pertaining to the design and fabrication of semiconductor nonvolatile memory devices will appreciate that various modifications and changes may be imparted to the specifically described embodiments without departure from the scope of the invention. Consequently, the invention is to be understood as embracing all subject matter included within the literal scope of the appended Claims, as well as equivalents thereof. For example, the invention is not to be construed as limited to the specific materials and thicknesses identified herein. Similarly, those skilled in the art understand that conductivity types (P-type, N-type) may, in general, be reversed, provided that requisite consistency is preserved. Accordingly, the Description and the Figures are properly construed are illustrative of the invention, rather than delimiting, and all modifications to or departures from them are consequently comprehended by the scope of the subject invention.

Similarly, benefits, advantages, capabilities and solutions to operational or other technical challenges have been enumerated with respect to the specific embodiments of the invention, as provided herein. However, the benefits, advantages, capabilities and solutions, and any elements(s) or limitation(s) that give rise to any such benefit, advantage, capability and solution, or that enable or cause the same to become more pronounced, are not to be considered or construed as a critical, required, or essential element or limitation of any or all of the Claims, either expressly or by implication or estoppel. Furthermore, as used herein, the terms "comprises," "comprising," or any variation thereof, are intended to apply nonexclusively, so that a process, method, article or apparatus that comprises a recited enumeration of elements includes not only recited elements but also other elements not explicitly recited or enumerated but inherent to such process, method, article, or apparatus.

We claim:

1. A method of fabricating a semiconductor device, the method comprising:
   providing a semiconductor substrate having a surface and having a first area and a second area;
   forming a gate dielectric on the surface over the first area and over the second area;
   forming a sacrificial layer over the gate dielectric, wherein the sacrificial layer comprises silicon oxide;
   patterning the sacrificial layer so that the gate dielectric over the first area is exposed and a remaining portion of the sacrificial layer protects the gate dielectric over the second area;
   depositing a first metal gate conductor material over exposed gate dielectric and over the remaining portion of the sacrificial layer;
   patterning the first metal gate conductor material so that the remaining portion of the sacrificial layer is exposed;
   after patterning the first metal gate conductor material, removing the remaining portion of the sacrificial layer so as to expose the gate dielectric over the second area using a wet chemical etch; and
   depositing a second metal gate conductor material over the patterned first metal gate conductor material and directly on the gate dielectric that was exposed over the second area as a result of removing the remaining sacrificial layer.

2. A method of fabricating a semiconductor device as defined in claim 1, wherein the gate dielectric is a MeOx.

3. A method of fabricating a semiconductor device as defined in claim 2, wherein the MeOx is selected from the group consisting of $HfO_2$ and oxides or oxynitrides of zirconium, hafnium, aluminum, lanthanum, strontium, titanium, silicon and combinations thereof.

4. A method of fabricating a semiconductor as defined in claim 1, wherein the first metal gate conductor material is Ir.

5. A method of fabricating a semiconductor as defined in claim 1, wherein the second metal gate conductor material is TaSiN.

6. A method of fabricating a semiconductor as defined in claim 5, wherein the gate dielectric is a MeOx.

7. A method of fabricating a semiconductor as defined in claim 6, wherein the gate dielectric is $HfO_2$.

8. A method of fabricating a semiconductor as defined in claim 7, wherein the first metal gate conductor material is Ir.

9. A method of fabricating a semiconductor device as defined in claim 1, wherein:
   i. the first area of the substrate accommodates the formation of a pMOS transistor;
   ii. the first metal gate conductor material has a work function that approximates the valence band of silicon;
   iii. the second area of the substrate accommodates the formation of an nMOS transistor; and
   iv. the second metal gate conductor material has a work function that approximates the conduction band of silicon.

10. A method of fabricating a semiconductor device as defined in claim 9, wherein the gate dielectric is $HfO_2$.

11. A method of fabricating a semiconductor device, the method comprising:
   providing a semiconductor substrate having a surface and having a first area and a second area;
   forming a metal oxide gate dielectric on the surface over the first area and over the second area; and
   protecting the metal oxide gate dielectric against a subsequent metal etch by:
   imposing a first silicon oxide sacrificial layer directly on die metal oxide gate dielectric over the second area while providing an exposed portion of the metal oxide gate dielectric over the first area;
   depositing a first metal directly on the exposed portion of the metal oxide gate dielectric over the first area and over the first silicon oxide sacrificial layer;
   etching away the first metal over the second area using a dry etch;
   etching away the first silicon oxide sacrificial layer using a wet chemical etch; and
   depositing a second metal directly on the exposed portion of the metal oxide gate dielectric over the second area.

* * * * *

UNITED STATES PATENT AND TRADEMARK OFFICE
CERTIFICATE OF CORRECTION

PATENT NO.        : 6,972,224 B2  
APPLICATION NO.  : 10/400896  
DATED            : March 27, 2003  
INVENTOR(S)      : David C. Gilmer It is certified that error appears in the above-identified patent and that said Letters Patent is hereby corrected as shown below:

In Column 8, line 38, Claim No. 11:
    Change "die metal oxide" to --the metal oxide--

In Column 8, line 47, Claim No. 11:
    Change "silicon oxide sacrificial" to --silicon sacrificial oxide--

Signed and Sealed this

Thirteenth Day of May, 2008

JON W. DUDAS  
*Director of the United States Patent and Trademark Office*

UNITED STATES PATENT AND TRADEMARK OFFICE
CERTIFICATE OF CORRECTION

PATENT NO.         : 6,972,224 B2                                        Page 1 of 1
APPLICATION NO. : 10/400896
DATED                  : December 6, 2005
INVENTOR(S)         : David C. Gilmer It is certified that error appears in the above-identified patent and that said Letters Patent is hereby corrected as shown below:

In Column 8, line 38, Claim No. 11:
    Change "die metal oxide" to --the metal oxide--

In Column 8, line 47, Claim No. 11:
    Change "silicon oxide sacrificial" to --silicon sacrificial oxide--

This certificate supersedes the Certificate of Correction issued May 13, 2008.

Signed and Sealed this

Third Day of June, 2008

JON W. DUDAS
*Director of the United States Patent and Trademark Office*